(12) United States Patent
Molas et al.

(10) Patent No.: US 7,968,398 B2
(45) Date of Patent: Jun. 28, 2011

(54) METHOD FOR PRODUCING A FLOATING GATE WITH AN ALTERNATION OF LINES OF FIRST AND SECOND MATERIALS

(75) Inventors: Gabriel Molas, Grenoble (FR); Karim Aissou, Corenc (FR); Thierry Baron, Saint-Egrève (FR)

(73) Assignees: Commissariat a l'Energie Atomique, Paris (FR); Centre National de la Recherche Scientifique, Paris (FR); Universite Joseph Fourier, Grenoble (FR)

(*) Notice: Subject to any disclaimer, the term of this patent is extended or adjusted under 35 U.S.C. 154(b) by 392 days.

(21) Appl. No.: 12/320,269

(22) Filed: Jan. 22, 2009

(65) Prior Publication Data

US 2009/0203205 A1 Aug. 13, 2009

(30) Foreign Application Priority Data

Feb. 8, 2008 (FR) ...................................... 08 00665

(51) Int. Cl.
*H01L 21/8238* (2006.01)
(52) U.S. Cl. ........................................ 438/201; 257/317
(58) Field of Classification Search .................... 438/201
See application file for complete search history.

(56) References Cited

U.S. PATENT DOCUMENTS

| 7,045,851 B2 | 5/2006 | Black et al. |
|---|---|---|
| 2003/0193064 A1 | 10/2003 | Wu |
| 2004/0256662 A1 | 12/2004 | Black et al. |
| 2005/0287717 A1 | 12/2005 | Heald et al. |
| 2008/0193658 A1* | 8/2008 | Millward ...................... 427/401 |

OTHER PUBLICATIONS

Baron et al., "Nucleation control of CVD growth silicon nanocrystals for quantum devices," *Microelectronic Engineering*, vol. 61/62, pp. 511-515, Jul. 1, 2002.
Park et al., "Directed Assembly of Lamellae-Forming Block Copolymers by Using Chemically and Topographically Patterned Substrates," *Advanced Materials*, vol. 19, pp. 607-611, 2007.
Mansky et al., "Controlling Polymer-Surface Interactions with Random Copolymer Brushes," *Science*, vol. 275, pp. 1458-1460, Mar. 7, 1997.
Tan et al., "Hafnium Aluminum Oxide as Charge Storage and Blocking-Oxide Layers in SONOS-Type Nonvolatile Memory for High-Speed Operation," *IEEE Transactions on Electron Devices*, vol. 53, No. 4, pp. 654-662, Apr. 2006.
Chin et al., "Low Voltage High Speed $SiO_2$ /AlGaN/$AlLaO_3$ /TaN Memory with Good Retention," *Electron Devices Meeting, IEDM Technical Digest*, pp. 158-161, Dec. 5-7, 2005.
Wang et al., "Long Retention and Low Voltage Operation Using $IrO_2$ /HfAlO/HfSiO/HfSiO/HfAlO Gate Stack for Memory Application," *Electron Devices Meeting, IEDM Technical Digest*, pp. 162-165, Dec. 5-7, 2005.

* cited by examiner

*Primary Examiner* — Quoc D Hoang
*Assistant Examiner* — Tony Tran
(74) *Attorney, Agent, or Firm* — Oliff & Berridge, PLC

(57) ABSTRACT

A diblock copolymer layer comprising at least two polymers and having a lamellar structure perpendicularly to a substrate is deposited on a first gate insulator formed on the substrate. One of the polymers of the diblock copolymer layer is then eliminated to form parallel grooves in the copolymer layer. The grooves are filled by a first metallic or semi-conductor material and the rest of the copolymer layer is eliminated. A second dielectric material is deposited to form a second gate insulator. The second gate insulator of the floating gate then comprises an alternation of parallel first and second lines respectively of the first and second materials, the second material encapsulating the lines of the first material.

5 Claims, 2 Drawing Sheets

METHOD FOR PRODUCING A FLOATING GATE WITH AN ALTERNATION OF LINES OF FIRST AND SECOND MATERIALS

BACKGROUND OF THE INVENTION

The invention relates to a method for producing a floating gate on a substrate, the floating gate comprising on a first gate insulator, in a plane parallel to the substrate, a second gate insulator comprising an alternation of parallel first and second lines respectively made from distinct first and second materials.

STATE OF THE ART

Flash memory has become an uncircumventable electronic product. Its high operating speed, long lifetime and low consumption have made it an indispensable element in a large number of products of mobile nature.

Flash memory is conventionally formed by a MOS transistor having a floating gate as base memory cell. Definition of a high state and a low state is achieved by injecting or eliminating charge carriers (generally electrons) into or from the floating gate of the transistor. The presence or absence of electrons in the floating gate modifies the electrical characteristics of the transistor which are then used to check whether the memory cell is in high state or in low state.

Increasing storage capacities with multibit flash memories is the subject of a large number of studies. Replacing conventional 2-bit (0 and 1) memories by multibit flash memories enables a multitude of intermediate levels to be defined, in addition to high and low states.

Figure 1:
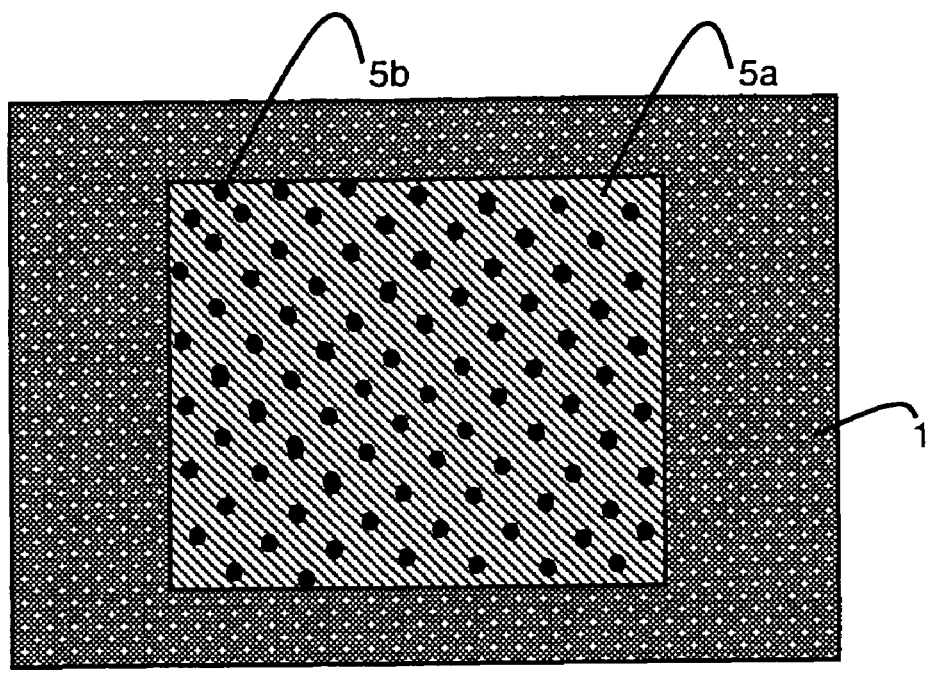

U.S. Pat. No. 7,045,851 describes the use of a diblock copolymer layer formed by polystyrene and polymethyl methacrylate (PMMA) deposited on a silicon oxide layer to form a discrete floating gate of a field effect transistor. The polymethyl methacrylate chains form a lattice of substantially cylindrical and vertical nodules 5b in a polystyrene matrix 5a in the diblock copolymer (FIG. 1). The polymethyl methacrylate nodule lattice is eliminated to form an etching mask which is reproduced on a silicon oxide layer. A lattice of amorphous silicon nodules similar to the polymethyl methacrylate nodule lattice is formed though this mask in the gate dielectrics of the floating gate. The major drawback of this kind of device is that the areas trapping the electrons, linked with a bit, are not physically delineated, resulting in unsatisfactory control of the threshold voltage of each bit. In addition, the presence of nodules between two areas trapping electrons may result in charge diffusion between these areas. This charge diffusion accentuates the poor control of the charge voltage.

The document US-A-2003/0193064 describes a flash memory having a floating gate formed by two elemental floating gates arranged side by side. Each elemental floating gate has well-controlled dimensions due to the fact that fabrication thereof involves the use of lateral spacers and successive deposition and etching steps. The size of this gate is limited by the photolithography method. This flash memory has well dissociated levels but its fabrication method is complex, costly and does not enable more than two elemental gates to be produced.

OBJECT OF THE INVENTION

The object of the invention is to provide a method for producing a floating gate that is easy to implement.

According to the invention, this object is achieved by the appended claims and more particularly by the fact that the method comprises, on the first gate insulator:
- deposition of a diblock copolymer layer comprising an alternation of at least two polymers in a plane parallel to the substrate,
- elimination of one of the polymers of the diblock copolymer layer to form parallel grooves in the copolymer layer,
- filling of the grooves by the first material to form the first lines,
- elimination of the rest of the copolymer layer,
- deposition of the second material, encapsulating the first lines.

BRIEF DESCRIPTION IF THE DRAWINGS

Figure 2:
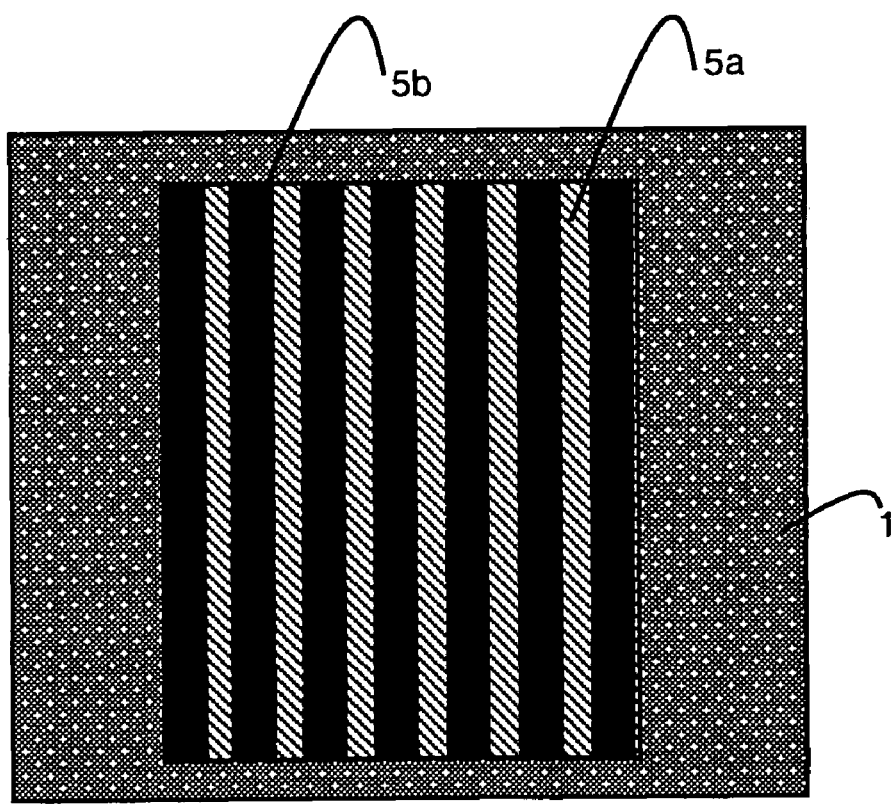
Figure 3:
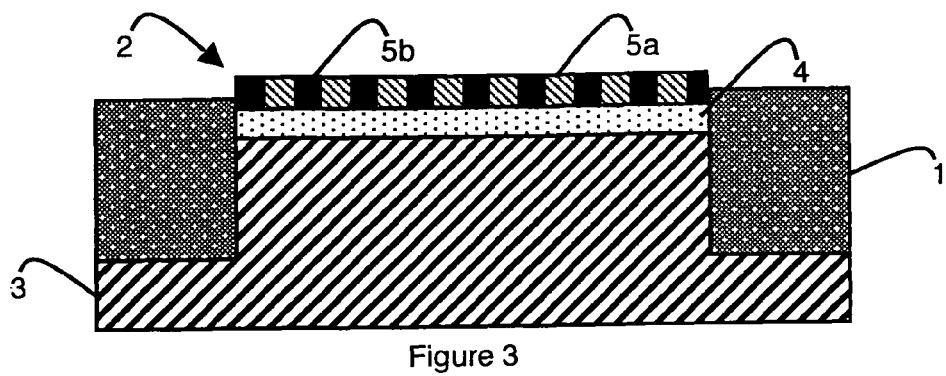
Figure 4:
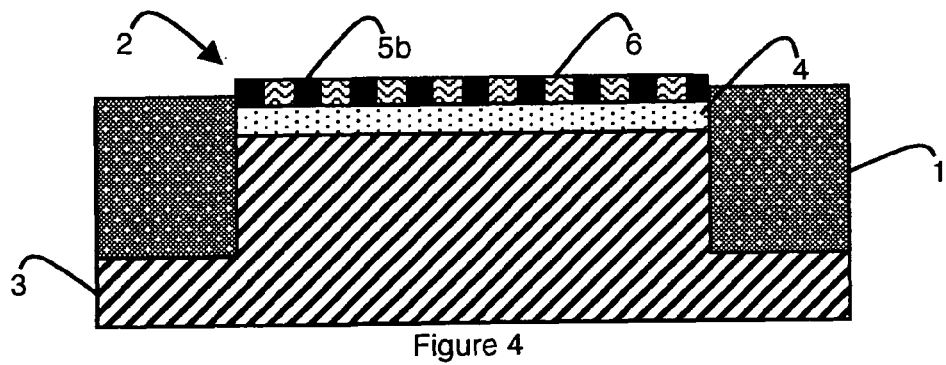
Figure 5:
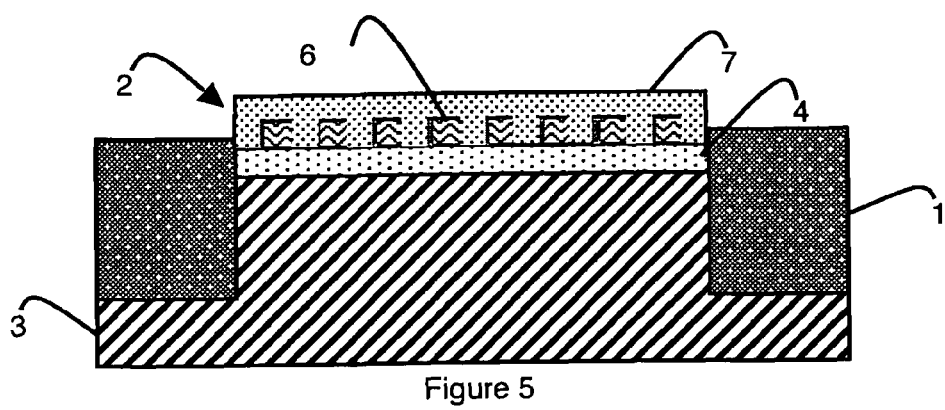

Other advantages and features will become more clearly apparent from the following description of a particular embodiment of the invention given for non-restrictive example purposes only and represented in the accompanying drawings, in which FIG. 1 schematically represents, in top view, a diblock copolymer deposited on an active area delineated by an insulating pattern and used for fabricating a floating gate according to the prior art, FIG. 2 schematically represents, in top view, the step of a method according to the invention, corresponding to FIG. 3, FIGS. 3 to 5 schematically represent the successive steps of a method according to the invention, in cross-section.

DESCRIPTION OF A PREFERRED EMBODIMENT OF THE INVENTION

As illustrated in FIGS. 2 and 3, an insulating pattern 1 delineates an active area 2 at the surface of a substrate 3. Insulating pattern 1 extends upwards beyond the surface of substrate 3 and active area 2 which it delineates. Insulating pattern 1 is for example formed by a lateral insulating trench, typically made from silicon oxide, which extends beyond the surface of substrate 3 by a height generally comprised between 100 and 500 Å. In conventional manner, substrate 3 is a bulk silicon substrate or a silicon on insulator substrate.

In FIGS. 3 to 5, substrate 3 comprises a first gate insulator 4 made of dielectric material, situated in active area 2. First gate insulator 4, for example made from silicon oxide, can be achieved by thermal oxidation of active area 2. First gate insulator 4 can also be made from silicon nitride $Si_3N_4$ or from dielectric material with a high dielectric constant which is conventionally used as a gate insulators in microelectronics, for example $HfO_2$, $Al_2O_3$, HfAlO, $ZrO_2$. Insulator 4 can also be made from TiO, SiON or HfSiO. A diblock copolymer layer 5 composed of at least two non thermodynamically miscible polymers 5a and 5b is deposited on this first gate insulator 4.

The thickness and composition of the polymers forming diblock copolymer 5 are chosen such that the diblock copolymer forms an alternation of the two polymers 5a and 5b in a plane parallel to substrate 3. This alternation of polymers substantially represents a lamellar structure perpendicularly to substrate 3 (FIGS. 2 and 3). Such a structure can be obtained by a copolymer that presents a structure called "lamellar" or in a structure called "flat-laid cylinders" perpendicularly to substrate 3. Such structures have been described in particular in the article by Park et al "Directed Assembly of Lamallae-Forming Block Copolymers by Using Chemically and Topographically Patterned Substrates", Advanced Materials, 2007, 19, pp. 607-611.

A copolymer 5 with a perpendicular lamellar structure is conventionally obtained when the composition of the chains is suitable, advantageously if the volume composition of one of the polymers is comprised between 0.35 and 0.65.

The diblock copolymer 5 is for example a mixture of polystyrene 5b and polymethyl methacrylate 5a. A perpendicular lamellar organization or a flat-laid cylindrical structure by means of this type of mixture are in particular described in the above-mentioned article by Park et al.

To obtain a perpendicular structure, i.e. an orientation of the chains that is parallel to the substrate, the interactions between the surface of the substrate and the different polymer blocks 5a and 5b have to be equal. If the surface of the substrate, here the first gate insulator 4, is not suitable, a perpendicular structure is then achieved by neutralizing the initial surface. Neutralization of a surface is conventionally achieved by means of a neutralization film (not shown), which can be a film of polymer material containing chains of the polymers of layer 5 but arranged randomly. An example of this realization is described by Mansky et al. "Controlling Polymer-Surface Interactions with Random Copolymer Brushes" Science 275, 1458, 1997. When first gate insulator 4 is made of silicon oxide, a neutralization film of polymer material comprising polymethyl methacrylate and polystyrene copolymer chains is deposited prior to diblock copolymer film 5 between the latter and first gate insulator 4.

In the case of a diblock copolymer 5 formed by first and second polymers 5a and 5b, for example polymethyl methacrylate and polystyrene, copolymer film 5 presents an alternation of each of the constituent elements 5a and 5b (FIGS. 2 and 3) perpendicularly to substrate 3, in active area 2. In other words, the polymer chains form parallel patterns or lines each having at least one surface in contact with first gate insulator 4 and a free opposite surface. The other surfaces of each line are, as a general rule, in contact either with insulating pattern 1 or with the other constituent of copolymer 5. Within active area 2, the diblock copolymer film presents at least two lines of one of its constituents separated by the other constituent of copolymer film 5. Alternation of first and second polymers 5a and 5b is preferably terminated at both ends with the same polymer (5b in FIG. 3).

The lattice pitch of layer 5 is controlled by the length of the polymer chains, while at the same time preserving the criterion relating to the composition of each of the polymers. The lattice pitch is chosen as a function of the size of active area 2 to avoid stressing the film.

The length of the polymer chains is further chosen such that the lines extend widthwise in the device, i.e. perpendicularly to the axis joining the source to the drain. In other words, the lines are parallel to the longitudinal axis of the future floating gate. In order to minimize its surface tension, the polymer that develops interactions of lesser energy with the insulating patterns will be adsorbed on the latter. This organization of the polymer chains functions for any diblock copolymer the two polymers of which present a different affinity with respect to the insulating material. This is in particular the case for the polystyrene 5b/polymethyl methacrylate 5a couple in an active area delineated by a silicon oxide insulating pattern 1. In this configuration, the lines defined by the alternation of polymers 5a and 5b are not oriented along the drain-source axis of the future floating gate transistor. Active area 2 is rectangular with its larger side oriented along the longitudinal axis of the future gate, so that the copolymer chains are oriented along this same dimension. The smaller dimension of the active area is therefore oriented along the source-drain axis of the future device. The dimensions of the active area are for example $0.25 \times 0.32$ μm$^2$.

In conventional manner, diblock copolymer layer 5 is patterned after it has been deposited to localize it above first gate insulator 4 only. Patterning of diblock copolymer 5 can for example be achieved by photolithography and etching or by chemical mechanical polishing.

As illustrated in FIG. 4, one 5a of the polymers of the diblock copolymer is then eliminated to form parallel grooves in copolymer layer 5. Elimination is performed by any suitable technique. For example, exposure under deep ultraviolet radiation enables the polymethyl methacrylate to be selectively eliminated. Layer 5 then comprises lines or rows formed by second polymer 5b, separated by grooves corresponding to the lines initially formed by the first polymer 5a that has been eliminated. First gate insulator 4 is then free at the location of the grooves. If a neutralization film is used, it is also patterned to form the grooves and leaves first gate insulator 4 free at the level of these grooves.

A first material 6, preferably a metallic or semi-conductor material, is then deposited and patterned so as to at least partially fill the grooves and thereby form first rows at the location of the rows (lines) made from eliminated first polymer 5a. First material 6 is for example amorphous or polycrystalline silicon or a porphyrin molecule having a metal atom (Zn, Co, Fe) in its center or a metal chosen from Fe, Co, Pt. First material 6 can also be a dielectric material, for example silicon nitride or a high-K dielectric material.

As illustrated in FIG. 5, the rest of diblock copolymer 5, i.e. second polymer 5b forming the second rows and the rest of the neutralization film if any, is then eliminated for example by etching using for example an $O_2$ plasma. A second material 7 is then deposited on first gate insulator 4 and on the first lines of first material 6. Second material 7 is a dielectric material advantageously chosen from the same materials as first gate insulator 4.

The choice of first and second materials 6 and 7 is made such that first material 6 (metal, semi-conductor or dielectric) is able to retain charge carriers (electrons or holes) and to prevent the latter from subsequently diffusing to second material 7 or to first gate insulator 4. If first material 6 that is able to trap charges is a dielectric material, it then presents a trap density that is substantially greater than that of second material 7 and of first gate insulator 4. The trap density present in a dielectric material is conventionally dependent on the deposition conditions of this material. It is thus possible to have distinct first and second materials 6 and 7 that present very close chemical compositions but distinct electrical properties.

In addition to the above-mentioned documents US-A-2003/0193064 and U.S. Pat. No. 7,045,851, different couples of first and second materials 6 and 7 are described by Tan et al "Hafnium Aluminium Oxide as Charge Storage and Blocking-Oxide Layers in SONOS-Type Nonvolatile Memory for High-Speed Operation" IEEE Transaction on Electron Devices, Vol. 53, No 4, April 2006, by Chin et al. "Low Voltage High Speed SiO2/AlGaN/AlLaO3/TaN Memory with Good Retention" Electron Devices Meeting, 2005. IEDM Technical Digest. IEEE International Volume, Issue, 5-7 Dec. 2005 Page(s): 158-161 and by Wang et al "Long Retention and Low Voltage Operation Using IrO2/HfAlO/HfSiO/HfAlO Gate Stack for Memory Application" Electron Devices Meeting, 2005, IEDM Technical Digest. IEEE International Volume, Issue, 5-7 Dec. 2005 Page(s): 162-165.

Deposition of second material 7 encapsulates the lines made from first material 6 thereby forming a second gate insulator comprising an alternation of first and second parallel lines, respectively of distinct first material 6 and second material 7, in a plane parallel to substrate 3. The first and second lines are respectively situated in lieu and place of first and second polymers 5a and 5b of diblock copolymer 5.

As an alternative embodiment (not shown), second material 7 can be patterned so as to only form the second lines of dielectric material separating the first lines of first material 6. An additional dielectric material is then deposited on the first and second lines to finalize the second gate insulator.

The rest of the device, in particular formation of the control gate, is then achieved in conventional manner, notably with deposition of a gate electrode, for example made of polysilicon, and with patterning of the gate.

The device obtained in this way is particularly advantageous as it enables a multibit memory having several well-defined bits to be produced, as each row of first material corresponds to a discrete gate, i.e. to a memory bit.

The invention claimed is:

1. A method for producing a floating gate on a substrate, comprising, on the first gate insulator:
    depositing a diblock copolymer layer comprising an alternation of at least two polymers in a plane parallel to the substrate,
    eliminating one of the polymers of the diblock copolymer layer to form parallel grooves in the copolymer layer,
    filling the grooves by a first material to form first rows,
    eliminating the rest of the copolymer layer,
    depositing a second material, encapsulating the first rows,
    the floating gate comprising, on a first gate insulator, in a plane parallel to the substrate, a second gate insulator comprising an alternation of parallel first and second rows respectively made from distinct first and second materials, and
    depositing a neutralization film between the first gate insulator and depositing the diblock copolymer layer.

2. The method according to claim 1, wherein the first material is a metallic material.

3. The method according to claim 1, wherein the first material is a semi-conductor material.

4. The method according to claim 1, wherein the second material is a dielectric material.

5. The method according to claim 1, wherein forming the grooves is achieved by exposure under deep ultraviolet radiation.

* * * * *